United States Patent [19]
Petersen et al.

[11] Patent Number: 6,088,228
[45] Date of Patent: Jul. 11, 2000

[54] PROTECTIVE ENCLOSURE FOR A MULTI-CHIP MODULE

[75] Inventors: Kurt H. Petersen, Austin; David L. Harper, Round Rock, both of Tex.

[73] Assignee: 3M Innovative Properties Company, St. Paul, Minn.

[21] Appl. No.: 09/213,058

[22] Filed: Dec. 16, 1998

[51] Int. Cl.[7] ..................................... H05K 7/20
[52] U.S. Cl. ..................... 361/720; 361/704; 361/707; 361/709; 361/710; 361/719; 361/752; 361/759; 165/80.2; 165/80.3; 165/185; 174/16.1; 174/16.3
[58] Field of Search ..................... 361/704, 707, 361/709, 710, 714–721; 257/718, 719, 726, 727; 165/16.1, 16.3, 185

[56] References Cited

U.S. PATENT DOCUMENTS

| | | | |
|---|---|---|---|
| 4,409,641 | 10/1983 | Jakob et al. | 361/386 |
| 4,492,878 | 1/1985 | Hamel | 307/127 |
| 5,109,317 | 4/1992 | Miyamoto et al. | 361/386 |
| 5,109,318 | 4/1992 | Funari et al. | 361/704 |
| 5,129,833 | 7/1992 | Rowlette, Sr. | 439/91 |
| 5,208,733 | 5/1993 | Besanger | 361/386 |
| 5,243,131 | 9/1993 | Jakob et al. | 174/52.1 |
| 5,289,337 | 2/1994 | Aghazadeh et al. | 361/718 |
| 5,353,194 | 10/1994 | Libretti et al. | 361/707 |
| 5,548,090 | 8/1996 | Harris | 174/252 |
| 5,699,229 | 12/1997 | Brownell | 361/719 |
| 5,754,400 | 5/1998 | Sathe et al. | 361/704 |
| 5,761,046 | 6/1998 | Hein et al. | 361/752 |
| 5,777,847 | 7/1998 | Tokuno et al. | 361/705 |

FOREIGN PATENT DOCUMENTS

| | | | |
|---|---|---|---|
| 31 28 856 A1 | 10/1983 | Germany | H05K 7/12 |

*Primary Examiner*—Leo P. Picard
*Assistant Examiner*—Boris H. Chervinsky
*Attorney, Agent, or Firm*—Matthew B. McNutt; Alan Ball

[57] ABSTRACT

A heat dissipating element, positioned inside a protective cover, removes heat from the vicinity of a multi-chip module comprising active semiconductor devices attached to a printed circuit board. Attachment of the protective cover to the printed circuit board uses a latching mechanism with minimum board space requirements.

4 Claims, 5 Drawing Sheets

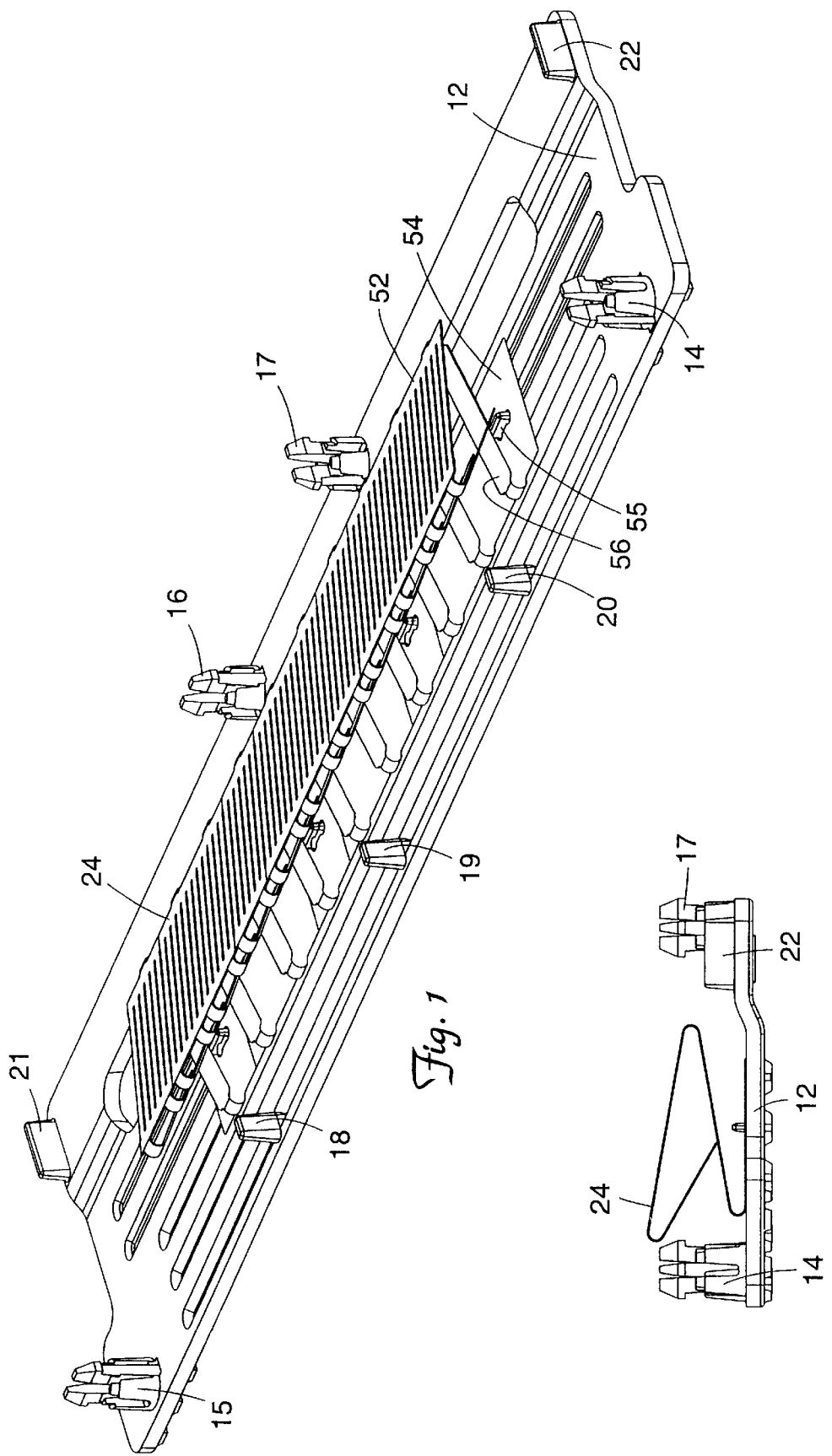

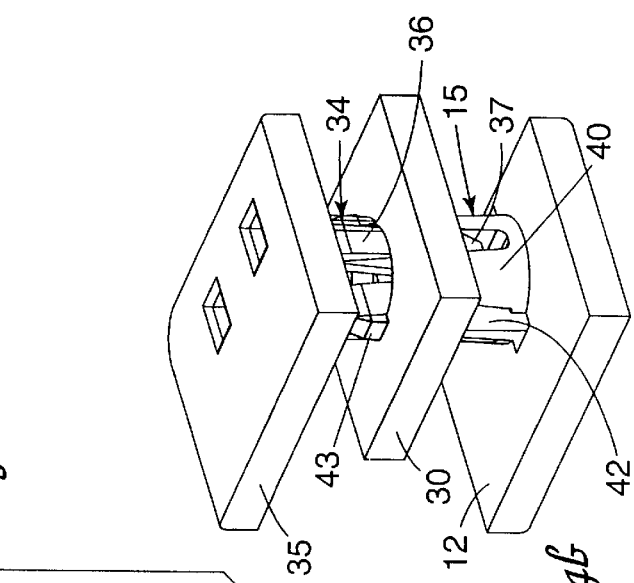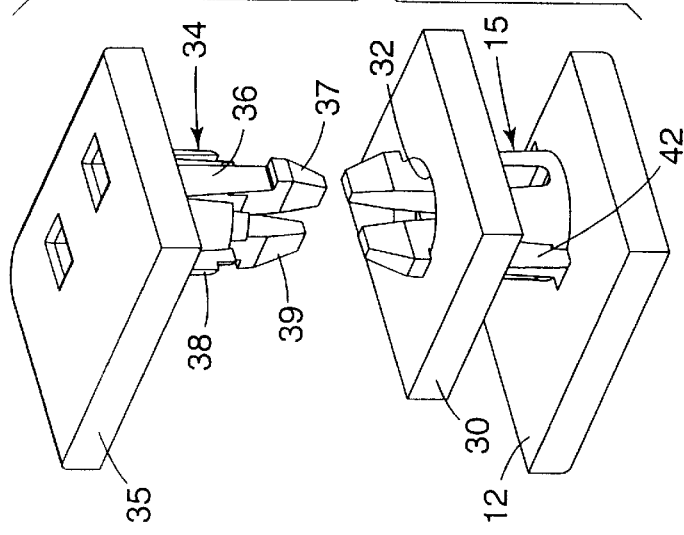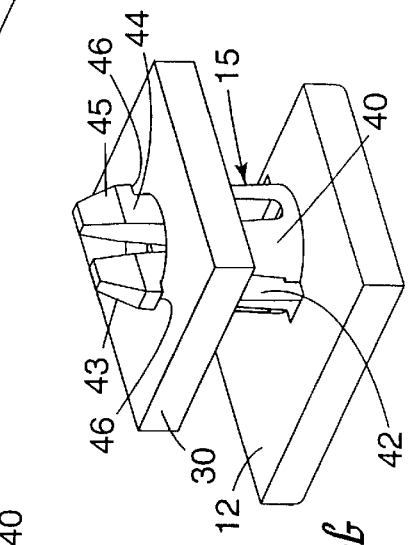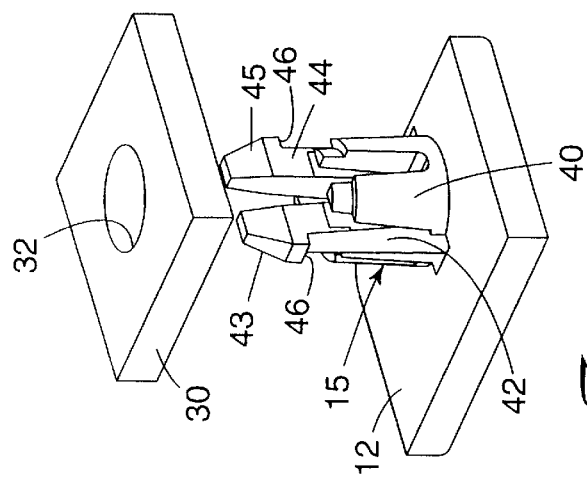

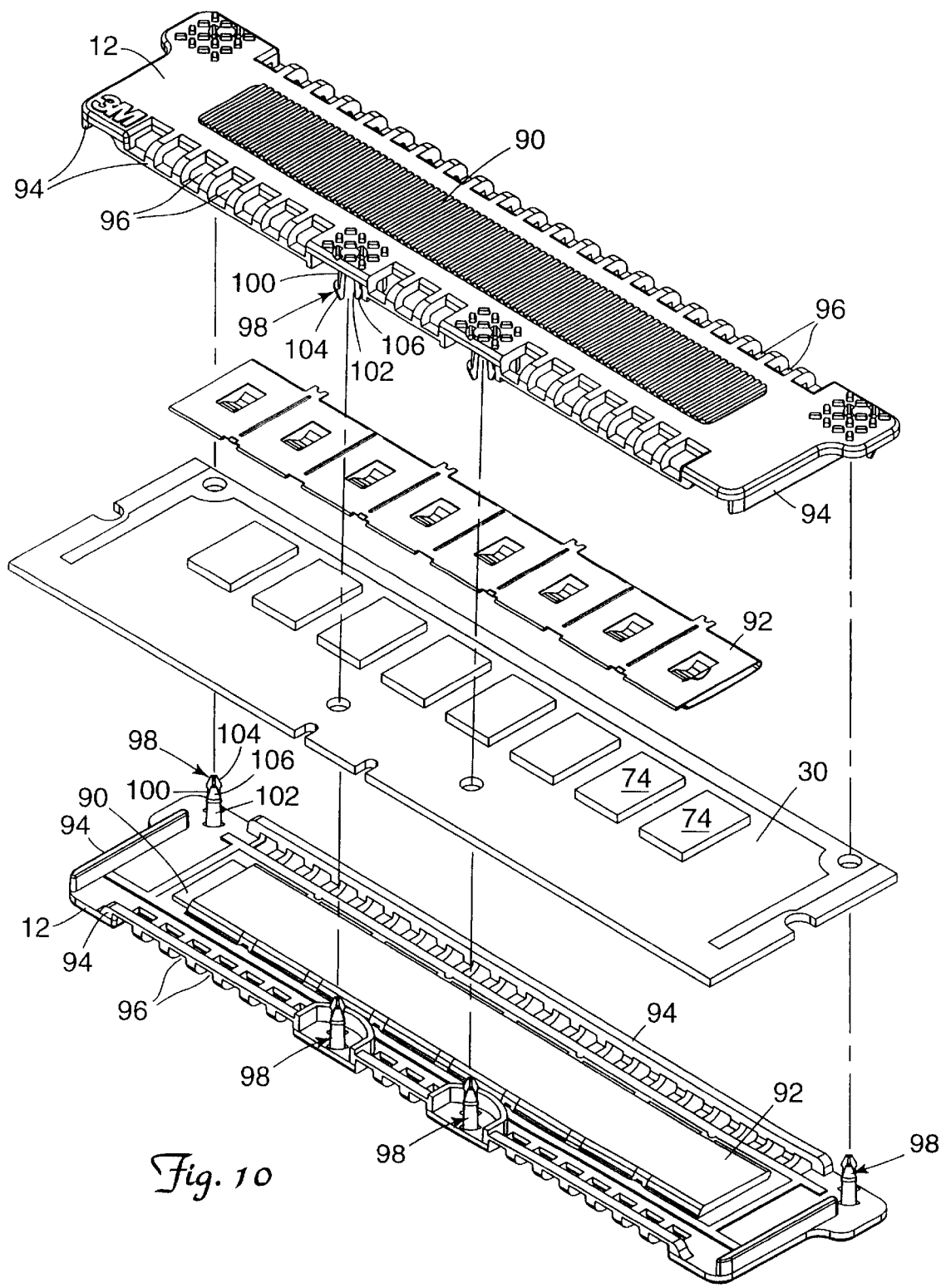

PROTECTIVE ENCLOSURE FOR A MULTI-CHIP MODULE

FIELD OF THE INVENTION

The invention relates to molded plastic structures used to form protective covers for multi-chip modules. Assembly of a covered module involves a unique latching mechanism for holding the module and the molded structures together. A heat dissipating element, inside the enclosure, prevents overheating during operation of the multi-chip module.

BACKGROUND OF THE INVENTION

Trends in the design of multi-chip modules and related electronic assemblies continue to emphasize the elimination of individual packages from semiconductor devices to allow more devices in less circuit board space. This results in improved electrical performance but causes an increase in the power density of the multi-chip module. Increased power density translates to higher module operating temperatures requiring more elaborate thermal design and thermal management schemes to prevent the device from overheating. Thermal management deals with a variety of means to remove heat from the proximity of active semiconductor devices. Suitable cooling means include heat conductive metal structures, such as heat sinks or heat spreaders, and fluid materials such as thermal greases and liquid coolants. Efficient thermal management requires contact or at least close proximity between cooling means and electronic assembly. The prior art includes multiple approaches towards the goal of efficient thermal management. U.S. Pat. No. 4,409,641 discloses a printed circuit, connecting multiple semiconductor devices, inside the cavity of an open-topped, electrically insulating housing. A metal cover completes the enclosure which fully surrounds the printed circuit. Heat removal from the enclosure requires a heat-conductive connection from metal surfaces inside the housing cavity to the cover which then loses heat by radiation. U.S. Pat. No. 4,811,165 also uses a metal plate to conduct heat from semiconductor devices attached to a flexible printed circuit material. The circuit assembly is fully enclosed by covers attached to either side of the heat conducting metal plate. U.S. Pat. Nos. 5,243,131 and 5,353,194 provide further evidence of the use of heat conducting metal structures for heat removal Cooling efficiency, using heat conducting plates, is hindered by lack of direct contact between the heat conducting, cooling element and the bodies of the heat generating semiconductor devices. To overcome this deficiency, a conductive paste or grease may bridge the space, between the devices and heat conducting surface, to facilitate the desired heat transfer. U.S. Pat. Nos. 5,109,317; 5,208,733; 5,289,337 and 5,777,847 describe structures that use a thermal grease or paste to enhance cooling.

Another method of removing heat from electronic assemblies, such as multi-chip modules, relies upon the circulation of cooling liquids close to the active semiconductor devices. Enclosures designed for this type of cooling must provide liquid circulation without leakage, thereby adding to the complexity of the design. Fully enclosed heat dissipating housings, using liquid cooling, include those described in U.S. Pat. Nos. 4,492,878 and 5,109,317.

With the exception of U.S. Pat. No. 5,777,847, the prior art, previously described, uses enclosures that fully surround the multi-chip modules or circuit components. In contrast, U.S. Pat. No. 5,777,847 provides a protective cover plate for a multi-chip module with semiconductor devices attached to a printed circuit board. Attachment of the cover plate to the circuit board uses at least one pillar held in contact with the board by an adhesive or a retaining pocket, sized to the cross-section of the pillar, or a screw connection of the base of the pillar into the circuit board. Each attachment means is subject to separation from the circuit board due, in one case, to adhesive failure or, in other cases, to loosening of mechanically held pillars. The pillar produces a space between the device-carrying surface of the printed circuit board and the underside of the cover plate so that the space extends to the perimeter of the circuit board. The cover plate may be metallic and include several plates in spaced parallel arrangement to increase cooling efficiency. With this design, heat may escape by air convection from the sides of the multi-chip module, as well as thermal conduction through the heat conducting cover plate structure. Despite its open structure the multi-chip module requires a thermal grease between the semiconductor devices and the cover plate to improve the rate of heat removal.

The current invention addresses disadvantages of previous thermal management schemes by providing a multi-chip module protecting package that includes at least one cover plate latched to the circuit board and having a spring biased heat spreader interposed between and in contact with the semiconductor devices and the inside of the cover.

In contrast to covers disclosed in U.S. Pat. No. 5,777,847, the cover plates described herein have little tendency to detach from the circuit board. This advantage of the current invention arises from the use of special latches having flexible posts inserted into mounting holes drilled through the circuit board. While passing through the mounting holes, the arrowhead-shaped tips of the flexible posts experience lateral compression until exiting on the opposite side of the board, when a stepped portion of the tips snaps against the exit surface to secure the latch in the mounting hole. In the absence of other design considerations, the cover cannot be removed after latch installation. The latch design allows space for two latches, in suitable orientation, to simultaneously occupy the same circuit board mounting hole. This orientation requires insertion of each one of a pair of latches from opposite sides of the circuit board, thus simplifying attachment of covers to either side of the board. Use of common mounting holes for attaching multiple covers further contributes to the desirable objective of free board space to add more semiconductor devices or reduce the area occupied, and hence the size, of a multi-chip module.

SUMMARY OF THE INVENTION

The invention provides a latching cover and thermal spreader unit for dissipating heat from a multi-chip module while providing a protective cover over the module. The protective unit uses a minimum of parts which are attached to the module and held together using unique latches extending from the surface of the latching cover.

The latching cover provides protection for the delicate board and chip assembly, clearance for the flow of cooling air and a surface for attachment of the thermal spreader. Suitable positioning of the thermal spreader provides maximum contact to transfer heat from the hot chips to the heat spreader thereby dissipating the heat over a larger area for more efficient radiation and convection cooling.

More specifically the invention provides a protective cover for attachment to a printed circuit board. The cover has a shell having an internal surface and an external surface and at least one latch to attach the protective shell to the circuit board. The latch, which is secured to the internal surface of the shell, has a base and at least one post having first and second ends, with a first end flexibly attached to the base, the second end including a toothed element to grip the circuit board after inserting the latch into a hole formed in the circuit board. A lamellar heat dissipating element may be joined to the internal surface of the shell to conduct heat from the circuit board when the protective cover is in place.

BRIEF DESCRIPTION OF THE DRAWINGS

FIG. 1 presents a perspective view of a cover of the invention including a heat spreader.

FIG. 2 is a cross section of a cover showing the location of latches at the edge of the cover.

FIG. 3a is an exploded (fragmented) view providing detail of the latching mechanism used to attach single or multiple covers to a printed circuit board.

FIG. 3b is a detail view showing a latch secured through a hole formed in a printed circuit board.

FIG. 4a is a detail view showing a latch secured from below a printed circuit board and a second latch in a position above the printed circuit board for insertion into the same hole.

FIG. 4b is a detail view showing one latch inserted from below the printed circuit board interposed in a common hole with a second latch inserted from above the printed circuit board.

FIG. 10 is an alternate embodiment of the present invention.

DETAILED DESCRIPTION OF THE INVENTION

Figure 5:
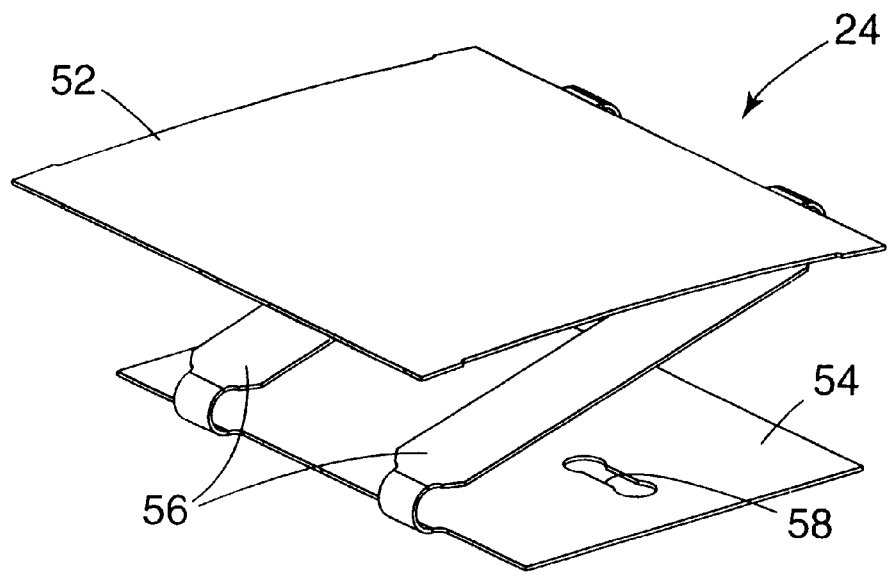
FIG. 5 is a perspective drawing providing detail of the heat spreader of the invention.

The invention provides a molded plastic structure, or shell, as a means to protect fragile components, of, e.g. an electronic multi-chip module comprising semiconductor devices distributed over a printed circuit board. A single molded structure may be used to protect all or a portion of the multi-chip module, or a plurality of plastic structures or shells may be combined to fully cover the module. Regardless of the extent of coverage of the electronic components on the circuit board, attachment of the molded plastic shells uses a unique latching system that allows one or more shells to removably engage the printed circuit board using receiving holes machined through the board for desired positioning of the protective shell. The protective shell, upon attachment to the circuit board, produces a closed environment around selected components. Since electronic components tend to produce heat when energized, the temperature of the environment will increase and, without heat removal, the electronic components may be damaged. This is typically true even when the electronic components are in relatively open environments. The problem of heat dissipation is even greater when the electronic components are in a closed environment. To avoid damage to the electronic components, each protective shell accommodates a heat spreader to extract heat from the components and distribute it across the heat spreader to promote radiative and convective cooling.

The invention will now be described with reference to the drawings wherein like numbers designate like components.

FIG. 1 shows a molded plastic structure 10 of the invention. This structure includes a protective shell 12 with a number of latches 14, 15, 16, 17 formed integrally with the shell. In addition, the protective shell 12 includes a number of stand-off elements 18, 19, 20, 21, 22 which engage the surface of the printed circuit board to maintain a space between the shell body and the electronic multi-chip module. A heat spreader 24, located in the space between the shell 12 and multi-chip module, removes heat from the module while it is in an operating condition. The heat passes from the electronic components to the surfaces of the heat spreader 24 and thereafter dissipates by convection, past the stand-offs 18–22 which maintain the space for passage of air around the circuit board. It will be noted that the number and positions of stand-offs 18–22 may be altered to suit particular applications.

The protective shell 12 illustrated in FIG. 1 requires a multi-chip module provided with four receiving holes through the circuit board to receive the four latches 14–17. Of course, it will be readily recognized that any suitable number of latches and corresponding receiving holes may be used, depending upon the particular application. If the circuit board requires protection of both of its major surfaces, first and second shells may be secured from opposing sides of the circuit board using the same receiving holes to hold latches from both shells independently.

The latches are retained in the receiving holes by a pair of flexible posts, having tip portions with the approximate profile of an arrow-head. The point of the tip portion, upon entering a receiving hole, causes the post to flex until the skirt portion of the tip passes through the hole and engages the exit surface of the circuit board.

Engagement of the latches with the circuit board is shown in FIGS. 3a and 3b. FIGS. 3a and 3b show a small section of a printed circuit board 30 which includes a receiving hole 32, suitable for receiving one of the latches 14–17 molded into the protective shell 12. With reference to, e.g. a selected latch 15, FIG. 3a shows that the latch includes a base 40, of equal height with the standoffs 18–22, a first post 42 and a second post 44 coplanar with the first post 42. Like standoffs 18–22, base 40 functions to space protective shell 12 from circuit board 30 by an appropriate distance. The posts 42, 44 bend relative to the base 40 with each post having a pointed tip 43, 45 extending from the base. Each tip 43, 45 has an approximately arrowhead profile and the dimensions of a gap between the flexible posts 42, 44 determines the proximity of one tip relative to the other tip. It will be recognized by those skilled in the art that base 40 could be eliminated from the latch member, such that the posts 42, 44 extend directly from shell 12. The spacing function of base 40 could then be replaced by additional standoff projections positioned adjacent to the posts 42, 44 of the latch member.

When attaching a protective shell 12 to a circuit board 30 of a multi-chip module, the tips 43, 45 of latch posts 42, 44 pass through a hole 32 in a circuit board 30. As the latch enters the hole 32 the edges of the hole engage the pointed tips 43, 45, moving the pointed tips 43, 45 closer together and causing a narrowing of the gap between the flexible posts 42, 44. When the pointed tips 43, 45 fully traverse the thickness of the circuit board, the spring tension in the flexible posts 42, 44 urges separation of the pointed tips 43, 45. The skirt portions 46 of the pointed tips 43, 45 then engage the exit rim of the hole 32 formed in the circuit board 30. FIG. 3b shows a latch 15 fully seated in a receiving hole 32. In this position, the latch can be withdrawn from the receiving hole only if the latch includes an optional feature allowing the posts to be manually flexed, on the entry side of the hole 32, to reduce the separation between the tips 43, 45 of the latch 15.

A distinguishing feature of the current invention is shown by reference to FIGS. 4a and 4b. In this case a receiving hole 32 accommodates a first latch 15 and a second latch 34 which is integrally formed with a second protective shell 35. In FIG. 4a, a latch 15 already occupies the receiving hole 32 but leaves enough space on either side of the blade-like posts 42, 44, to insert the second latch 34. The second latch 34 enters the hole 32 from the opposite side of the circuit board 30 with the plane of the coplanar posts 36, 38 of second latch 34 at 90° to the plane of the coplanar flexible posts 42, 44 of first latch 15. With this orientation, the tips 37, 39 of second latch 34 slide into the gap between the posts 42, 44 and travel the thickness of circuit board 30 until the tips 37, 39 exit and lock against the opposite side of the circuit board 30. When both latches 15, 34 are correctly seated, as in FIG. 4b, the first latch straddles the second latch, thereby producing an interposed gripping relationship between them. This latching arrangement allows positioning of protective shells on both sides of a printed circuit board by inserting latches at a 90° orientation to each other in common receiving or mounting holes formed in the printed circuit board. With latches suitably designed, the protective shells may be removably positioned, when needed, for access to the electronic components forming the multi-chip module.

As noted above, multi-chip modules may overheat during operation unless heat transfer is provided. This problem is made worse by the limited space inside the protective covers. This necessitates provision of a means for heat dissipation. Heat dissipation means take a variety of forms including heat transfer fluids, cooling fans, structures with cooling fins and metallic heat conducting elements which include heat spreaders. As illustrated in FIGS. 1 and 2, the current invention uses a heat spreader 24 with a metallic heat conducting element or platform 52, affixed by a thin metal mounting plate 54, to studs 55 formed on the inside of the protective shell 12. A series of spring strips 56 separate the heat conducting platform from the mounting plate 54. Each portion of the platform 52, the spring strips 56 and the mounting plate 54 may be formed from a single metal sheet. FIG. 5 shows a heat spreader 24 comprising the heat conducting platform 52, spring strips 56, and mounting plate 54, folded with the cross section in the shape of the letter "Z." The "Z" shape produces a spring biased heat conducting platform which flexes, relative to the mounting plate 54, and which tends to evenly distribute its pressure over the electronic components. Of course, other spring biasing shapes may be used, such as a "C" shaped element, or other shapes as may be recognized as being suitable by those skilled in the art. The mounting plate includes several holes 58 of suitable size and design to grip the studs 55, formed on the inside surface of the protective shell 12. This provides a means to connect the heat spreader to the shell in correct alignment by simply press fitting the holes 58 over studs 55. Other methods of connecting heat spreader 24 to shell 12 could also be used, such as adhesives, ultrasonic welding, or other methods recognized by those skilled in the art.

Figure 6:
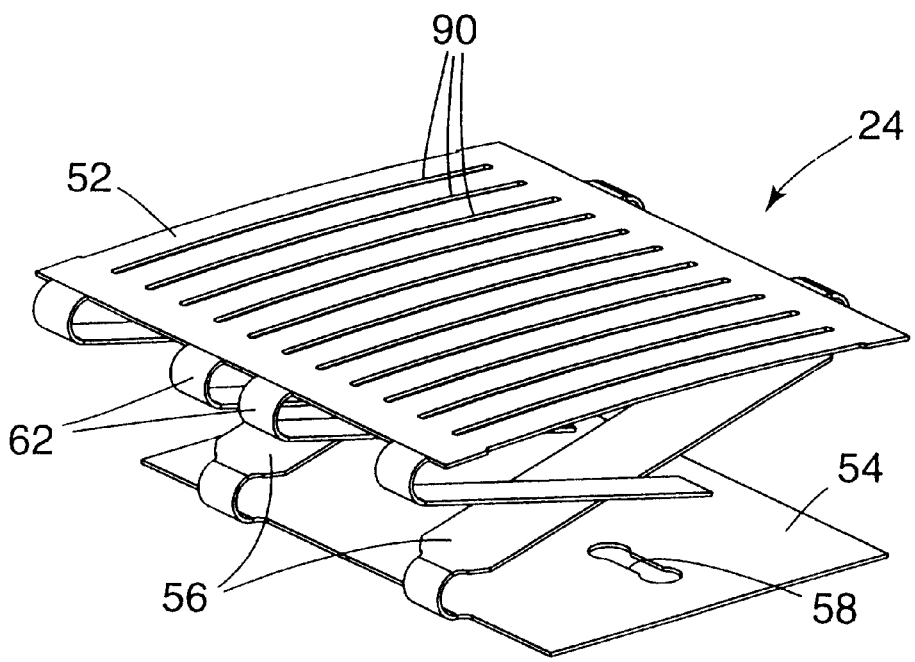
FIG. 6 is a perspective drawing of an alternative embodiment of the heat spreader of the invention, including a second set of spring strips as additional biasing elements.

An alternate embodiment of the heat spreader 24 is shown in FIG. 6. The alternate embodiment includes a first set of multiple spring strips 56 to provide a resilient connection between the heat conducting platform 52 and the mounting plate 54. A second set of spring strips 62, on the opposite side of the platform 52 from the first set of spring strips 56, lie close to the underside of the platform, thereby providing a series of leaf springs at an approximate angle of 30°. These leaf springs provide additional tension in the heat spreader when it is compressed, causing the free ends of the leaf springs to engage the surface of the mounting plate 54. The use of both sets of spring strips 56, 62 increases the biasing force exerted on the heat conducting platform 52 to improve its contact with the semiconductor devices attached to the printed circuit board.

Figure 7:
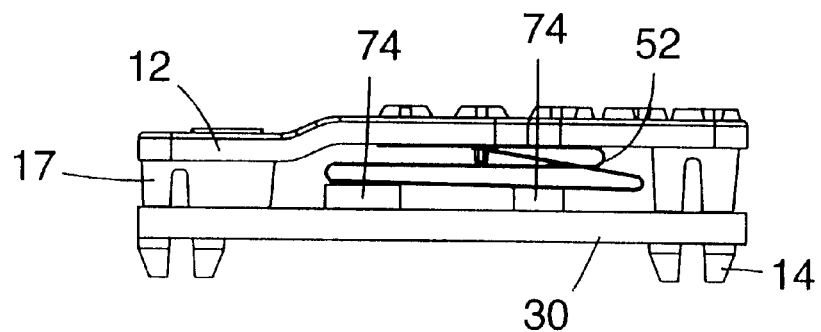
FIG. 7 is a side view of an assembly including a cover attached to a printed circuit board with the heat spreader of the invention in contact with electronic modules.

Upon attachment of a heat spreader 24 and protective cover 12 to a circuit board 30, as shown in FIG. 7, the spring biased heat conducting platform 52 impinges against the outward facing surfaces of, e.g., several electronic chips 74, with sufficient force to provide an effective thermal link from the surfaces of the electronic chips 74 to the platform 52 and then throughout the metal of the spreader 24. This facilitates heat transfer from the multi-chip module to the heat spreader 24 which radiates heat, or is subject to losses by convection through the gaps between the printed circuit board 30 and the cover 12. Separation between the board 30 and cover 12 depends upon the respective height of the standoffs 18–22 and the base 40 of the respective latches 14–17.

Figure 8:
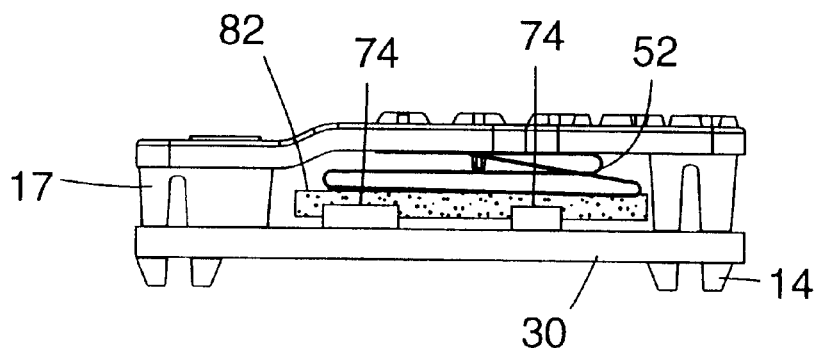
FIG. 8 is a side view of an assembly including a thermal pad interposed between the heat spreader of the invention and electronic modules.

A noted above, the "Z" shape of the heat spreader forms a very compliant assembly which compensates for manufacturing irregularities, including differing chip heights, associated with specifications from different manufacturers. Accommodation of differences in chip height results from selection of a variety of methods for changing the surface of the heat conducting platform to increase its compliance. One approach, shown in FIG. 8, employs a commonly available thermally conducting, resilient gasket or pad material 82. The thermal pad 82, interposed between the heat spreader platform 52 and electronic chips 74, mounted on the printed circuit board 30, provides additional cushioning that partially compensates for non-planar placement of the electronic chips. Also, the thermal pad 82 conforms to the contours of the electronic chips 74 to increase the area for heat migration from the chips 74 to the thermal pad 82.

A second method to provide the needed compliance for non-planar mounting of the devices, involves providing a series of narrow slots 90 formed in a portion of the heat conducting platform 52 to reduce its rigidity and allow better contact according to the contours of the electronic components.

Figure 9:
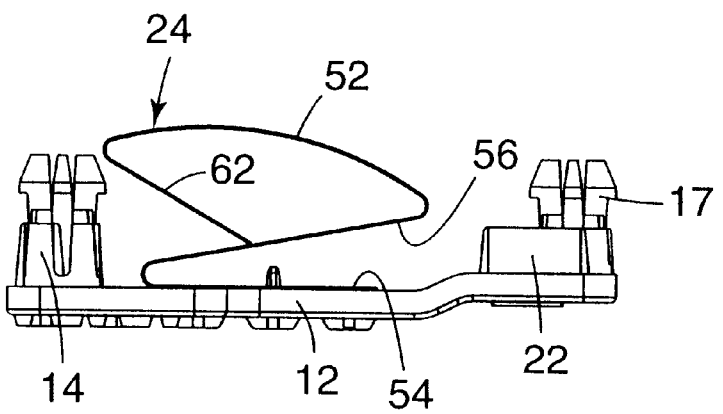
FIG. 9 is a side view of the present invention illustrating a heat spreader with a laterally bowed contact platform.

Further enhancement of contact between the heat conducting platform and heated devices resides in modifying the shape of the platform 52 to include lateral bowing of the platform 52. As seen in FIG. 9, this bowed shape causes a central longitudinal portion of the platform to function as the initial area of contact between the platform 52 and the semiconductor devices 74, with resulting spreading of the contact force from the center towards the edges of the heat conducting platform 52. The bowed platform concept provides benefits for continuous heat spreaders and those with slots formed in a portion of the heat conducting platform.

FIG. 10 shows an alternate embodiment of the invention in which shell 12 is provided with a heat sink 90, preferably formed of metal. Heat sink 90 also functions to stiffen shell 90. Heat sink 90 makes contact with C-shaped heat spreader 92, which in turn contacts chips 74 on circuit board 30. Shell 12 is provided with longitudinal ribs 94 which extend around the periphery of shell 12 and function to properly space shell 12 from circuit board 30. Ribs 94 replace individual stand-offs as illustrated in FIG. 1. To allow adequate air circulation between shell 12 and circuit board 30, vents 96 are provided along the edges of shell 12. Latches 98 each include first and second posts 100, 102, with retention features 104, 106, respectively, which secure shell 12 to circuit board 30 in the manner described above.

Preferred structures described herein are not considered limiting since other variations fall within the scope of the invention as defined by the appended claims.

What is claimed is:

1. A protective cover for attachment to a printed circuit board, having at least one mounting hole formed therein, said cover comprising:

a shell having an internal surface and an external surface;

at least one latch to attach said protective shell to said circuit board, said latch secured to said internal surface of said shall, said latch comprising a base and at least one post having first and second ends, said first end attached to said base, said second end including a toothed element to grip said board after inserting said latch into said at least one mounting hole formed in said circuit board; and a heat dissipating element joined to said internal surface of said shell to conduct heat from said circuit board with said shell attached thereto, wherein said heat dissipating element is a metal sheet that includes a heat conductive platform in close proximity to said circuit board;

an attachment plate to join said heat dissipating element to said internal surface of said shell; and a biasing element between said heat conductive platform and said attachment plate to provide a flexible connection therebetween.

2. The protective cover of claim 1 wherein said heat dissipating element is a "z-fold" element having said heat conductive platform folded over said biasing element and said attachment plate folded under said biasing element.

3. The protective cover of claim 1 wherein at least a portion of said heat conductive platform includes a plurality of slots extending through said metal sheet.

4. The protective cover of claim 1 wherein said biasing element comprises a plurality of metal strips connecting said heat conductive platform to said attachment plate.

* * * * *